(12) United States Patent
Ikeda et al.

(10) Patent No.: US 8,105,761 B2
(45) Date of Patent: Jan. 31, 2012

(54) INK JET RECORDING HEAD MANUFACTURING METHOD

(75) Inventors: Masumi Ikeda, Kawasaki (JP); Etsuko Hino, Tokyo (JP); Isamu Horiuchi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 392 days.

(21) Appl. No.: 12/359,081

(22) Filed: Jan. 23, 2009

(65) Prior Publication Data
US 2009/0191488 A1    Jul. 30, 2009

(30) Foreign Application Priority Data

Jan. 25, 2008  (JP) ................................. 2008-014759

(51) Int. Cl.
*G03F 7/20* (2006.01)
(52) U.S. Cl. ..................................................... 430/320
(58) Field of Classification Search ........................ None
See application file for complete search history.

(56) References Cited

U.S. PATENT DOCUMENTS

| | | | |
|---|---|---|---|
| 5,478,606 A | 12/1995 | Ohkuma et al. | |
| 7,682,779 B2 * | 3/2010 | Ishizuka | 430/320 |
| 7,692,317 B2 * | 4/2010 | Franosch et al. | 257/787 |
| 2007/0099121 A1 * | 5/2007 | Kubota et al. | 430/311 |
| 2008/0160454 A1 * | 7/2008 | Shimomura et al. | 430/320 |
| 2008/0309733 A1 * | 12/2008 | Horiuchi et al. | 347/65 |
| 2010/0255422 A1 * | 10/2010 | Ishizuka et al. | 430/312 |

FOREIGN PATENT DOCUMENTS

| | | | |
|---|---|---|---|
| JP | S63-221121 A | | 9/1988 |
| JP | H02-140219 A | | 5/1990 |
| JP | 09-029981 | * | 2/1997 |
| JP | J2000-318167 | * | 11/2000 |
| JP | 2005-125577 A | | 5/2005 |
| JP | 2005-125619 A | | 5/2005 |
| JP | 2006-110910 A | | 4/2006 |
| WO | 2007/063690 | * | 6/2007 |

* cited by examiner

*Primary Examiner* — Martin Angebranndt
(74) *Attorney, Agent, or Firm* — Canon U.S.A., Inc. IP Division

(57) ABSTRACT

A method of manufacturing a liquid discharge head including a flow path forming member configured to form a flow path communicating with a discharge port to discharge liquid, includes, providing a first layer which includes a photosensitive resin and a light absorption agent on a substrate, and providing a second layer which includes a positive photosensitive resin but substantially does not include the light absorption agent on the substrate, so as to coat the first layer, forming a pattern having a shape corresponding to the flow path by performing a patterning process, and providing a layer which becomes the flow path forming member on the substrate, so as to coat the pattern. The method further includes forming the discharge port by performing a patterning process including exposure of the layer that becomes the flow path forming member, and forming the flow path by removing the pattern.

7 Claims, 5 Drawing Sheets

INK JET RECORDING HEAD MANUFACTURING METHOD

BACKGROUND OF THE INVENTION

1. Field of the Invention

The present invention relates to an ink jet recording head a method of manufacturing the same, which may be capable of generating a relatively small-sized recording droplet adapted for use in an ink jet recording scheme.

2. Description of the Related Art

In recent years, as demand has increased for printers having enhanced definition and increased fineness, it has become more necessary to miniaturize ink droplets and downsize the discharge port dimensions. Therefore, it has become increasingly important to manufacture and control microstructure such as a nozzle shape with relatively high accuracy.

As a method of manufacturing such an ink jet recording head, U.S. Pat. No. 5,478,606 discloses the following procedures. First, an ink flow path pattern is formed by a soluble resin on a substrate, on which energy generating elements are mounted. Next, a nozzle forming material layer, which includes an epoxy resin and a photocationic polymerization initiator, and which becomes an ink flow path wall, is formed on the ink flow path pattern. Discharge ports are formed above the energy generating elements by a photolithography process. Then, the soluble resin is eluted, and the nozzle forming material that becomes the ink flow path wall is cured.

As the nozzle is made to be of increasing fineness, it can occur that minute details of the shape of patterns may become neglected. As an example, a deformation in the shape of the discharge port may occur due to light reflected from the substrate in the photolithography process. That is, the shape of the discharge port patterns may be slightly different from that of the mask pattern. It is believed that the deformation in the shape of the discharge port patterns may arise from the unexposed portions, which may become slightly cured due to irradiation by light reflected from the substrate surface formed with the energy generating elements upon exposing the pattern of the discharge port.

As a countermeasure, Japanese Patent Application Laid-Open No. 2006-110910 discusses the following method. In the method of Japanese Patent Application Laid-Open No. 2006-110910, the nozzle forming material contains a light absorption agent that is not involved in a curing reaction. Therefore, when the pattern of the nozzle forming material is exposed, the light reflected from the substrate surface is attenuated in the nozzle forming material, so that the nozzle forming material is not cured in a region to be formed with the discharge port. However, in the above-mentioned methods of manufacturing the ink jet recording head, since another substance is contained in the nozzle forming material, it may be difficult to control the patterning process.

On the other hand, methods of including the light absorption agent in the soluble resin that forms the ink flow path pattern have been reported by Japanese Patent Application Laid-Open No. 2005-125577 and Japanese Patent Application Laid-Open No. 2005-125619. These methods aim to generate less scum (i.e., development residue) in the vicinity of the discharge port. The residue is believed to be generated because reflected light on the interface between the ink flow pattern and the nozzle forming material layer is generated when ultraviolet light irradiates the nozzle-forming material, and enters an originally unexposed portion to cause slight curing in the vicinity of the interface of the ink nozzle-forming material layer. As a countermeasure, a light absorption agent is added to the soluble resin in Japanese Patent Application Laid-Open No. 2005-125577, and the soluble resin is formed in two stages where the light absorption agent is added to the upper stage thereof in Japanese Patent Application Laid-Open No. 2005-125619. According to these methods, since a compatible layer is formed at the interface between the nozzle forming material layer and a resin containing the light absorption agent, the ultraviolet light reflected at the resin layer interface is attenuated in the compatible layer, so that the generation of residue is suppressed or significantly reduced. However, in the above-mentioned methods of manufacturing the ink jet recording head, since another substance is contained in the ink flow path pattern, it may be difficult to control the patterning process.

SUMMARY OF THE INVENTION

In one embodiment in accordance with the invention, a method of manufacturing a liquid discharge head, which includes a flow path forming member configured to form a flow path communicating with a discharge port to discharge liquid, is provided. In this method, a first layer which includes a photosensitive resin and a light absorption agent is provided on a substrate. A second layer which includes a positive photosensitive resin but substantially does not include the light absorption agent is provided on the substrate, so as to coat the first layer. A pattern having a shape corresponding to the flow path is formed by performing a patterning process including exposure of a portion of the second layer. A layer which becomes the flow path forming member is provided on the substrate, so as to coat the pattern. The discharge port is formed by performing a patterning process including exposure of the layer which becomes the flow path forming member, where the light absorption agent included in the first layer absorbs light of a wavelength used in the exposure of the layer which becomes the flow path forming member. The flow path is formed by removing the pattern.

Further features of the present invention will become apparent from the following description of exemplary embodiments with reference to the attached drawings.

DESCRIPTION OF THE EMBODIMENTS

Embodiments of the present invention will now be described in detail in accordance with the accompanying drawings.

The inventor(s) of the invention have conducted dedicated studies in order to achieve the objects by resolving the problems of the above-mentioned related art. As a result, the inventor(s) found that the problems are able to be resolved at least in part by providing a multilayer structure of the ink flow path pattern, where the multilayer structure includes a layer containing a light absorption agent and a layer not containing the agent, and the layer not containing the agent coats the layer containing the agent.

Hereinafter, aspects of the invention will be described in detail.

FIGS. 3A to 3H are cross-sectional views schematically illustrating an example of manufacturing of an ink jet recording head in accordance with aspects of the invention.

Figure 3A:
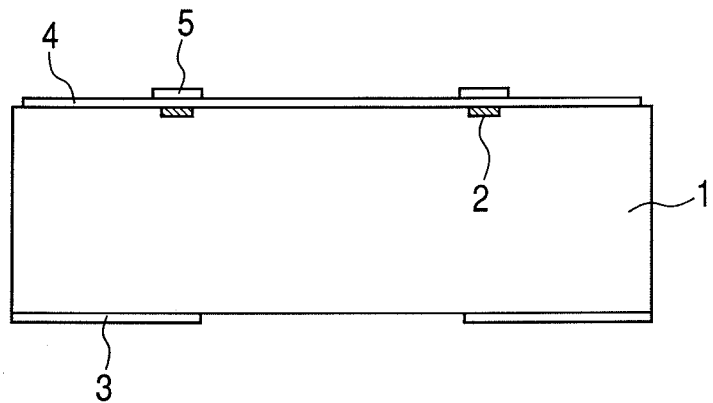
FIGS. 3A, 3B, 3C, 3D, 3E, 3F, 3G and 3H are cross-sectional views schematically illustrating an example of manufacturing an ink jet recording head in accordance with the invention.
Figure 3B:
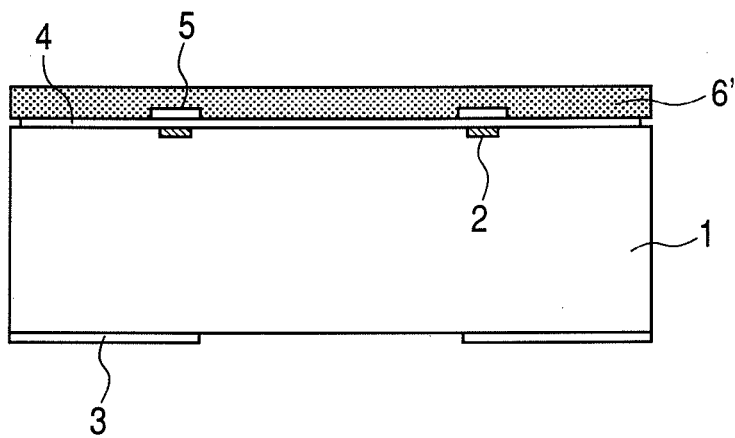
Figure 3C:
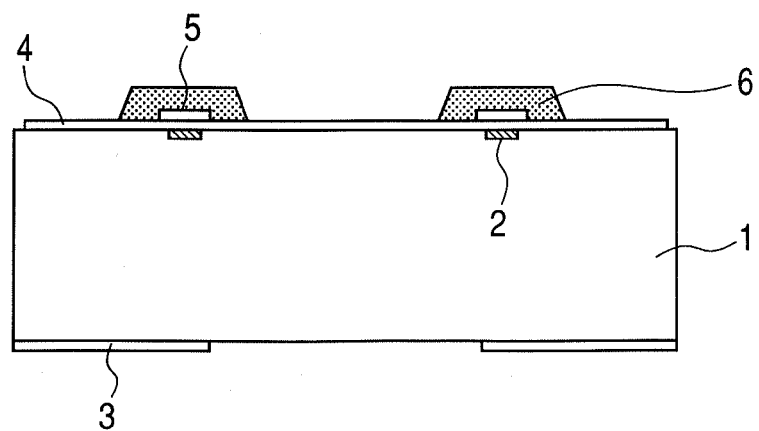

As shown in FIG. 3C, in one embodiment a first ink flow path pattern 6, which includes a first soluble resin and a light absorption agent, is formed on a substrate 1. The first ink flow pattern 6 can comprise, for example a first layer comprising the first soluble resin and the light absorption agent formed on the substrate 1.

For example, in one embodiment, any one or more of a glass substrate, a ceramic substrate, a plastic substrate and a silicon substrate may be used as the substrate 1. On the substrate 1, plural energy generating elements 2, such as for example at least one of an electro-thermal conversion element and a piezoelectric element, may be formed. Control signal input electrodes configured to operate the elements may also be connected. An inorganic insulating layer, such as for example one or more of SiN and $SiO_2$, or an anti-cavitation layer such as Ta, may be further provided on the substrate 1.

In terms of the first soluble resin provided in the first ink flow path pattern 6, in one version the first soluble resin may be a soluble resin that can form a pattern that becomes an ink flow path, and that can then can be dissolved and removed. Various materials can be provided as the resin. In one version, a positive photosensitive resin can be used, which may allow the ink flow path pattern to be relatively easily formed as well as fairly easily dissolved and removed by irradiating with ultraviolet light. Various materials may be suitable for use as the positive photosensitive resin. In one version, to provide process resistance against various manufacturing processes, photodegradable polymer materials may be suitable for use. For example, at least one of polymethylisopropylketone, polymethylmethacrylate and polymethylglutaramide may be used.

In one embodiment, a light absorption agent, which can absorb waves in an exposure wavelength band of a nozzle forming material, is added to the first soluble resin in order to suppress the deformation of a discharge port 9 by reflected light, as is described in more detail below. As the material comprising the light absorption agent, a material may be used that can absorb one or more wavelengths of light in the exposure wavelength band of the nozzle forming material. Furthermore, in general, various types of apparatus, such as for example an aligner that uses a high-pressure Hg lamp, may be used as an apparatus for exposing a photosensitive material. In one version, to form a pattern having relatively high accuracy, a stepper may be used. For example, in a patterning process including the exposure of a layer that becomes the flow path forming member (e.g., a nozzle forming material layer 8), as is described in more detail below, an i-line stepper may be used. Accordingly, in one example, when an i-line stepper is used, a light absorption agent that absorbs ultraviolet light of 365 nm wavelength can be used. Examples of such light absorption agents can comprise one or more of the following materials: benzophenone derivatives such as 2,4-dihydroxybenzophenone, 2-hydroxy-4-methoxybenzophenone, 2-hydroxy-4-n-octoxybenzophenone, 2-hydroxy-4-n-dodecyloxybenzophenone, 2-hydroxy-4-benziloxybenzophenone, 2,2'-dihydroxy-4-methoxybenzophenone, 2-hydroxy-4-methoxybenzophenone, and 2,4-di-t-butylphenyl-3',5'-di-t-butyl-4-hydroxybenzoate; salicate derivatives such as phenyl salicate, and 4-t-butylphenylsalicate,; thioxanthone derivatives such as 2-isopropylthioxanthone, 2-nitrothioxanthone, 2-methylthioxanthone, 2,4-dimethylthioxanthone, 2,4-diethylthioxanthone, 2,4-diisopropylthioxanthone, 2-chloro-7-trifluoromethylthioxanthone, thioxanthone-10,10-dioxido, and thioxanthone-10-oxide; quinine derivatives such as camphorquinone, naphthoquinones, and anthraquinones; and anthracene derivatives such as 9,10-diethoxylanthracene, 9,10-dipropoxyanthracene, and 9,10-dibutoxyanthracene. However, it should be understood that materials other than the above-mentioned examples can also be used, without departing from the scope and spirit of the invention.

In one version, the amount of the light absorption agent added may be deemed to be sufficient if the additive amount is enough to suppress the reflected light from the substrate surface upon forming a discharge port 9.

In one version, a material that is included in the first ink flow path pattern 6 can have an absorbance of 0.1 to 2.0 at a wavelength of 365 nm. If the absorbance is less than 0.1, it can occur that the suppression effect of the light reflected at the substrate surface upon forming the discharge port 9 may be decreased. If the absorbance exceeds 2.0, it can occur that the sensitivity of the first soluble resin may be excessively decreased, and there may be some concern that it may be difficult to remove the resin. In one version, the material included in the first ink flow path pattern 6 may have an absorbance of 0.4 to 1.2, at the wavelength of 365 nm.

According to one embodiment, the first ink flow path pattern 6 is formed so as to coat a region where the discharge port 9 is formed over the substrate 1, as viewed from above the substrate 1. In one version, the first ink flow path pattern 6 may have an aim of suppressing the light reflected from the substrate surface upon forming the discharge port 9, and thus the first ink flow path pattern 6 may be configured such that at least a region formed below the discharge port is coated. For example, the first ink flow path pattern 6 may comprise a first layer that is provided at a position opposite a position where the discharge port 9 is formed. As another example, the first layer of the ink flow path pattern 6 may be positioned at a region of the substrate 1 that is below the discharge port 9 forming in the layer which becomes the flow path forming member (e.g., the nozzle forming material layer 8), as viewed from above the discharge port 9 in a direction of the substrate, when the layer which becomes the flow path forming member is exposed in a patterning process, as is described in more detail below. Further, since the first ink flow path pattern 6 may be configured to be coated by a second ink flow path pattern 7, the region having the first ink flow path pattern 6 formed thereon may also have the second ink flow path pattern formed thereon.

According to one aspect of the invention, the first ink flow path pattern 6 may not be limited to a single layer. Instead, in one version the first ink flow path pattern 6 may be formed as multiple layers which are different from each other, for example in the additive amount of the light absorption agent provided in each layer. Furthermore, the first ink flow path pattern 6 may also optionally include a layer that does not include the light absorption agent.

As an example, in one version an application liquid, which includes the first soluble resin and the light absorption agent, is coated as a film on the substrate 1, and a patterning process is performed on the film, so that the resulting first ink flow path pattern 6 may be formed. The patterning process can be performed, for example, by exposing portions of the film other than the portion that forms the first ink flow path pattern 6, and then dissolving and removing the exposed portion. The thickness of the first ink flow path pattern 6 can be in a range of, for example, 0.1 to 20 μm.

Figure 3D:
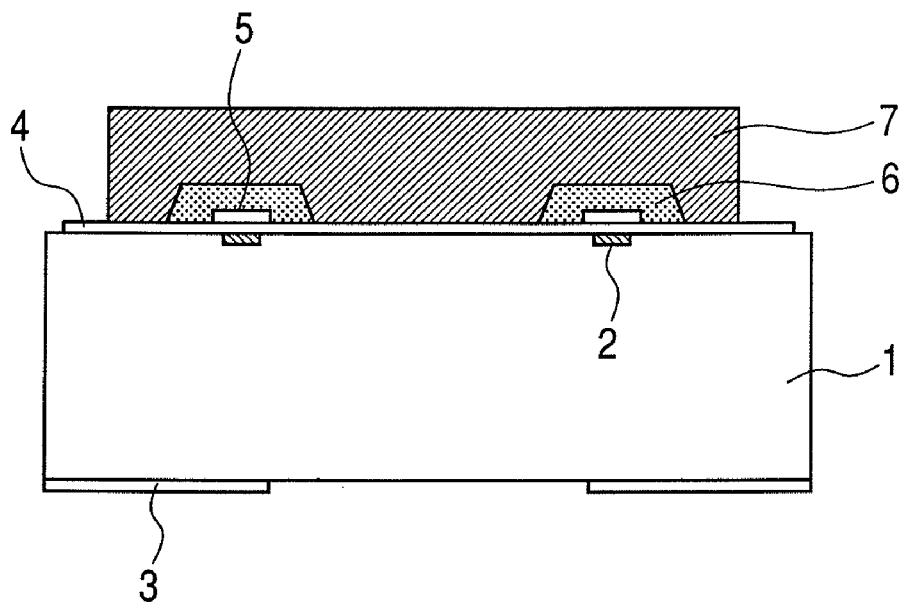

Next, as shown in the example illustrated in FIG. 3D, a second ink flow path pattern 7 may be formed so as to coat the first ink flow path pattern 6, which second ink flow path pattern 7 substantially and even entirely does not include the light absorption agent used in the first ink flow path pattern, but does include a second soluble resin. In one version, the second ink flow path pattern 7 comprises a second layer including the second soluble resin but substantially not including the light absorption agent, which is formed on the substrate 1 so as to coat the first ink flow path pattern 6. In one version, a material provided as the second soluble resin may be the same material as that of the above-mentioned first soluble resin For example, the second ink flow path pattern 7 may comprise a second layer having a positive photosensitive resin that is the same as the positive photosensitive resin used in a first layer forming the first ink flow path pattern 6.

According to one version, when the second ink flow path pattern 7 is formed, the light absorption agent is not used. The patterning characteristic of the second soluble resin may deteriorate if the light absorption agent is added thereto. Thus, according to one aspect of the invention, the first ink flow path pattern 6 that includes the light absorption agent is coated with the second soluble resin of the second ink flow path pattern 7 that does not include the light absorption agent. For example, the first ink flow path pattern 6 may comprise a first layer that is covered by a second layer of the second ink flow path pattern 7, so as to form a pattern that does not expose the first layer. Therefore, the patterning characteristic of the second soluble resin can be maintained.

As the nozzle is made finer, a ground contact area between the ink flow paths, that is, between the nozzle forming material and the substrate, may become narrower. In order to prevent the contact from peeling off due to the ink, it may be important that the ground contact area between the nozzle forming material and the substrate is as wide as possible. In one version, the above patterning scheme may be suitable for use when the nozzle (e.g., discharge port 9) to be formed is relatively fine, to provide an installation area for the nozzle forming material (e.g., layer which becomes the flow path forming member 8) and the substrate 1. For example, when the ink flow path pattern is made into a relatively thick film (e.g., >10 μm) and a draft width of the pattern is relatively small (e.g., <10 μm), the second ink flow path pattern for providing an installation area may be formed as perpendicular as possible (e.g., with a taper of 70° or more). The above patterning scheme may also be suitable for use in this case.

According to one version, an application liquid that does not include the light absorption agent but includes the second soluble resin is coated as a film on the substrate 1 having the first ink flow path pattern 6, and a patterning process is performed on the film, so the resulting second ink flow path pattern 7 may be formed. The patterning process can be performed, for example, by exposing portions of the film other than the portion forming the second ink flow path pattern 7, and then dissolving and removing the exposed portion. The thickness of the second ink flow path pattern 7 can be, for example, in a range of 1 to 30 μm at the position where the first ink flow path pattern 6 is formed. In one version, the method includes forming a pattern corresponding to the flow path by performing a patterning process including exposure of a portion of a second layer forming the second ink flow path pattern 7.

Figure 3E:
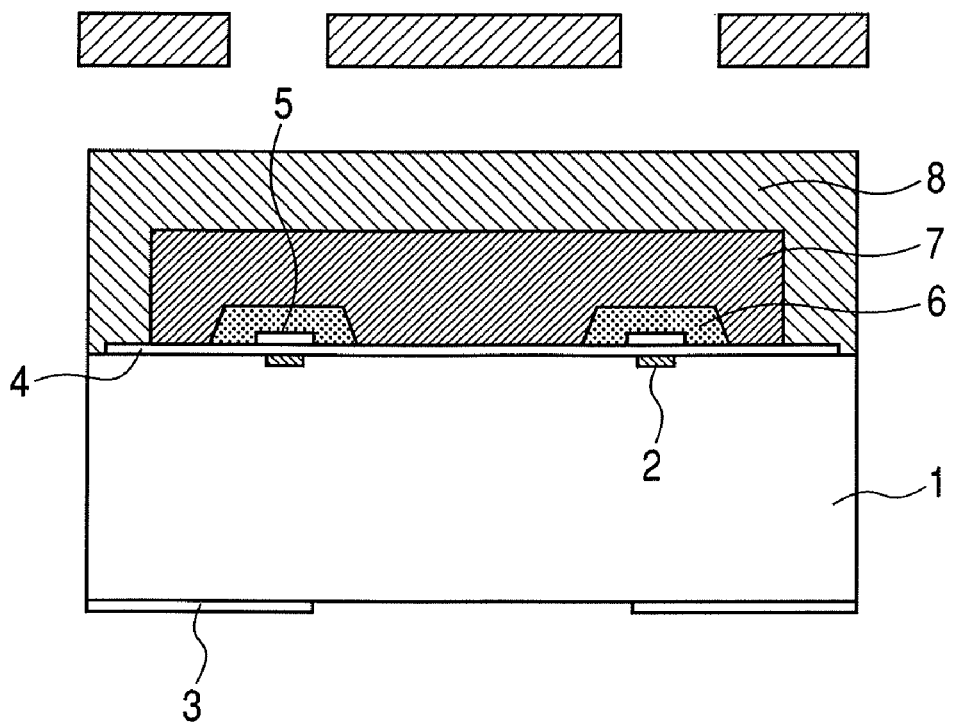
Figure 3F:
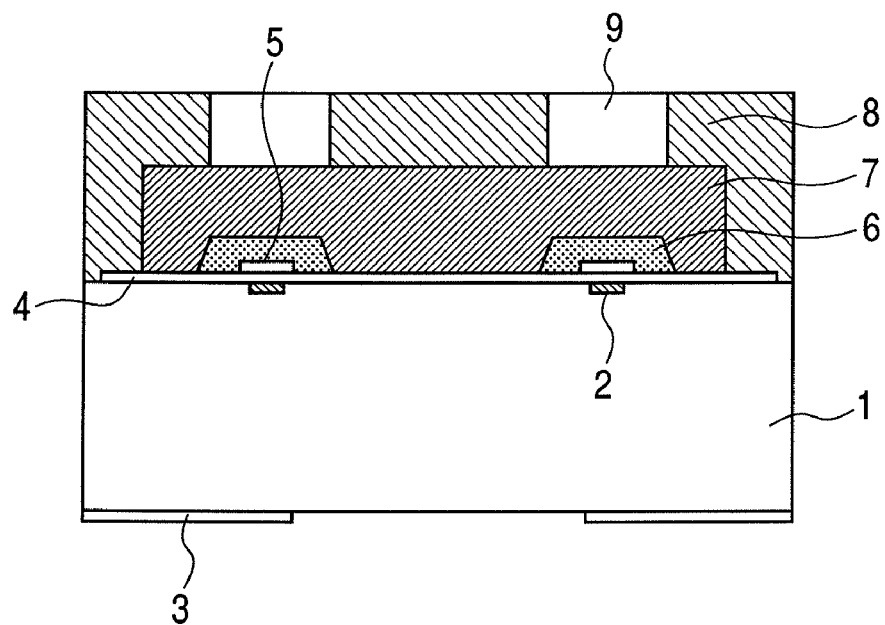

Next, as shown in the example illustrated in FIG. 3E, a nozzle forming material layer 8 (e.g., layer which becomes the flow path forming member) may be formed on the substrate 1 so as to coat the pattern that includes the second ink flow path pattern 7 and, as shown in FIG. 3F, a discharge port 9 may be formed in the nozzle forming material layer 8. In one version, as a nozzle forming material which forms the nozzle forming material layer 8 (e.g., layer which becomes the flow path forming member), for example, a cationic polymerization hardener of an epoxy resin can be used, which may be a general material described in Japanese Patent Application Laid-Open No. 2005-125577. Since the cationic polymerization hardener of an epoxy resin may have a relatively high crosslink density (high Tg) as compared with a hardener by a general acid anhydride or an amine, it may exhibit excellent characteristics as a structural material. Furthermore, by using an epoxy resin in a solid state at normal temperature, suppression of the diffusion of polymerization initiators into the epoxy resin may be achieved, which diffusion may otherwise be generated by the cationic polymerization initiator due to light irradiation thereof. Therefore, it may be is possible to obtain an excellent patterning accuracy and shape.

In one version, the epoxy resin in a solid state may be formed from at least one reactant having a molecular weight of substantially 900 or more, such as for example from one or more of reactants comprising bisphenol A and epichlohydrin, reactants comprising bromosphenol A and epichlohydrin, reactants comprising phenolnovolac or o-cresolnovolac and epichlohydrin, and polyfunctional epoxy resins having an oxycyclohexane skeleton, for example as described in Japanese Patent Application Laid-Open No. S60-161973, Japanese Patent Application Laid-Open No. S63-221121, Japanese Patent Application Laid-Open No. S64-9216, and Japanese Patent Application Laid-Open No. H02-140219.

Furthermore, in one version a compound suitable for use as the above-mentioned epoxy resin can comprise a compound having an epoxy equivalent of 2000 or less, such as a compound having an epoxy equivalent of 1000 or less. In a case where the epoxy equivalent exceeds 2000, it can occur that the crosslink density during the curing reaction may be decreased, so that a heat deformation temperature or Tg of the hardener may be decreased, or a problem may occur in an adhesion and an ink-resistant property.

In one version, the light cationic polymerization initiator for curing the epoxy resin can comprise at least one of an aromatic iodonium salt, aromatic sulfonium salt (see J. POLYMER SCI: Symposium No. 56 pp 383-395(1976)), SP-150, SP-170, and SP-172 ((brand names) commercially available from Asahi Denka Co., Ltd.)

Further, it may also optionally be possible to add further additive agents. For example, for purpose of lowering an elastic modulus of the epoxy resin, a flexibility agent may be added, or for purpose of obtaining further adhesive strength with the substrate, a silane coupling agent may be added.

In one version, the nozzle forming material layer 8 can be formed, for example, by coating the substrate 1 with an application liquid including the above-mentioned nozzle forming material on a region where the second ink flow path pattern 7 is formed. The thickness of the nozzle forming material layer 8 can be, for example, in a range of 1 to 100 μm at the position where the second ink flow path pattern 7 is formed.

In one version, the discharge port 9 extending into the nozzle forming material layer 8 can be formed, for example, by exposing and curing portions of the nozzle forming material layer 8 other than the portion that becomes the discharge port 9, and then developing the resulting layer. The size of the discharge port can be, for example, in a diameter range of 1 to 100 μm.

According to one version, the light absorption agent included in the first ink flow path pattern 6 may be, for example, a compound that imparts an adverse effect on the curing of the nozzle forming material layer 8. For example, the light absorption agent included in the first ink flow path pattern 6 may absorb light of a wavelength that is the same as that used in the exposure of the nozzle forming material layer 8 (e.g., layer which becomes the flow path forming member). However, since the nozzle forming material layer 8 and the first ink flow path pattern 6 are isolated from each other by the second ink flow path pattern 7 in the embodiment as shown, there may be substantially and even entirely no effect on the nozzle forming material layer 8.

Figure 3G:
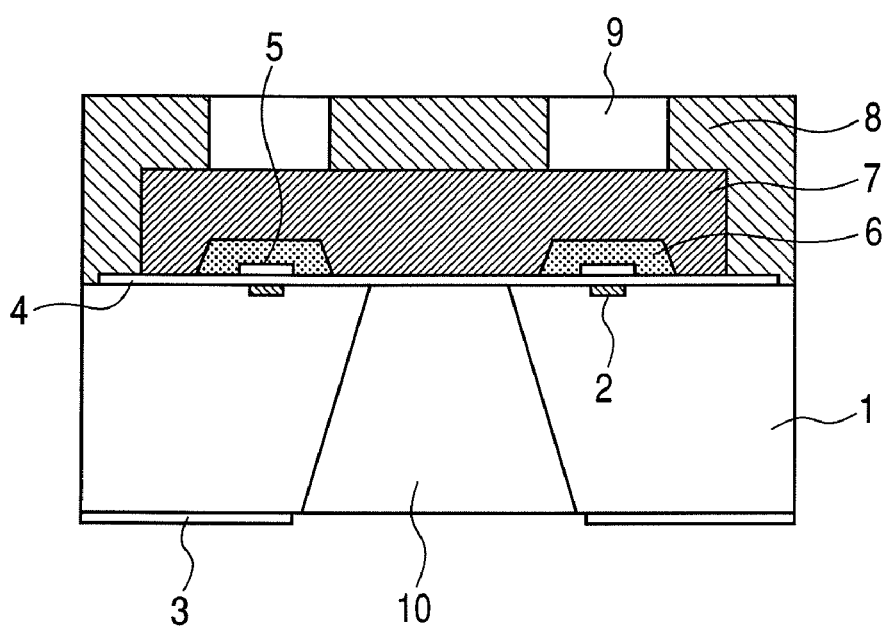
Figure 3H:
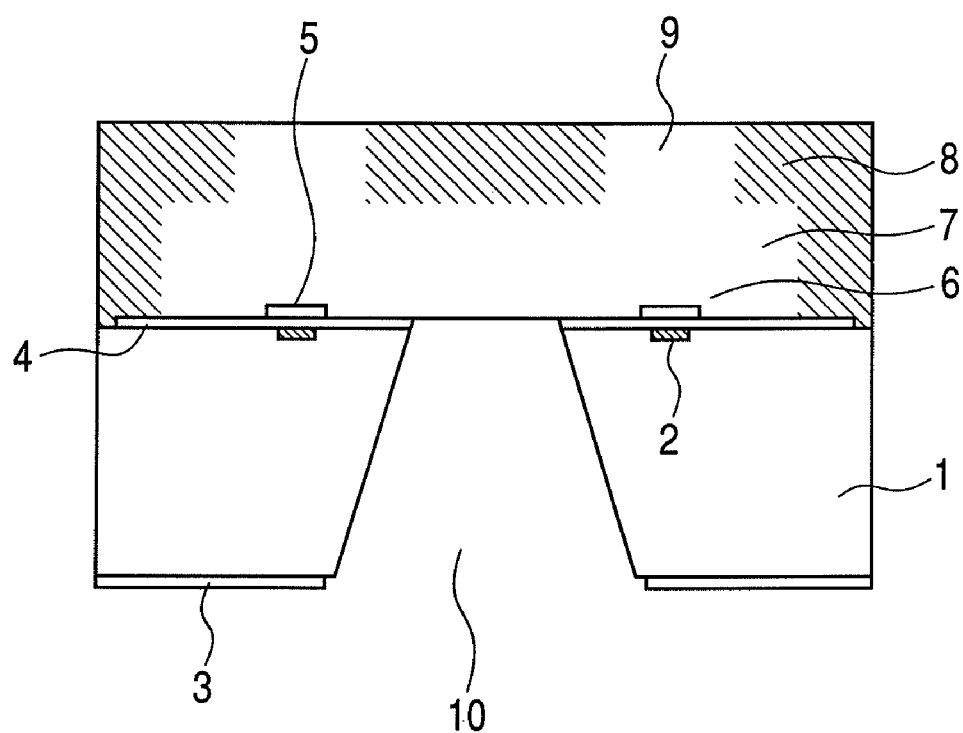

As shown in the example illustrated in FIG. 3H, the first ink flow path pattern 6 and the second ink flow path pattern 7 may be dissolved and removed, so that the ink flow path is formed. For example, when a positive photosensitive material is used, the ink flow path can be formed by exposing the entire surface from above to the light of a photosensitive wavelength of the positive photosensitive material, so as to dissolve and remove the first ink flow path pattern 6 and the second ink flow path pattern 7.

As shown in the example illustrated in FIG. 3G, it is also optionally possible to form an ink supply port 10 on the rear surface of the substrate 1 by using, for example, a silicon anisotropic etching scheme. Further, it may be possible to perform a heat treatment for completely curing the nozzle forming material layer 8.

According to the above-mentioned process, the ink jet recording head may be obtained on the substrate 1 formed with the energy generating element 2. The ink jet recording head includes the nozzle forming material layer 8 where the ink flow path and the discharge port 9 are formed.

Embodiments

Hereinafter, exemplary embodiments of the invention will be described in detail with reference to the accompanying drawings.

In Embodiment 1, the ink jet recording head was manufactured by using polymethylisopropenylketone as both the first and the second soluble resins, and 2-hydroxy-4-methoxybenzophenone as the light absorption agent. The specific manufacturing method is described as below.

Figure 2:
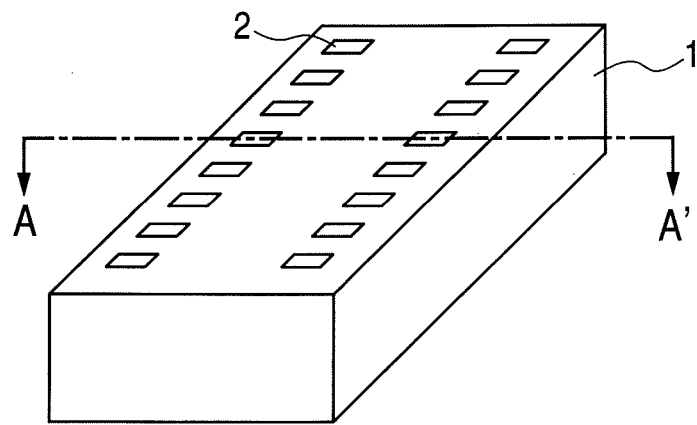
FIG. 2 is a perspective view schematically illustrating an embodiment of a substrate formed with an energy generating element.

In a first step of this embodiment, as shown in FIG. 2, plural electro-thermal conversion elements 2 as the energy generating elements were placed on the substrate 1, which included an Si wafer. The electro-thermal conversion elements 2 may be connected to a control signal input electrode (not shown) for operating the elements. In addition, as shown in FIG. 3A, an ink supply port forming mask 3, a protective film 4 and a cavitation protective film 5 were formed on the Si wafer substrate 1. FIGS. 3A-3H are cross-sectional views schematically illustrating an ink jet recording head taken along a line A-A' of FIG. 2, and thus the following processes will be described according to these schematic cross-sectional views.

Figure 1:
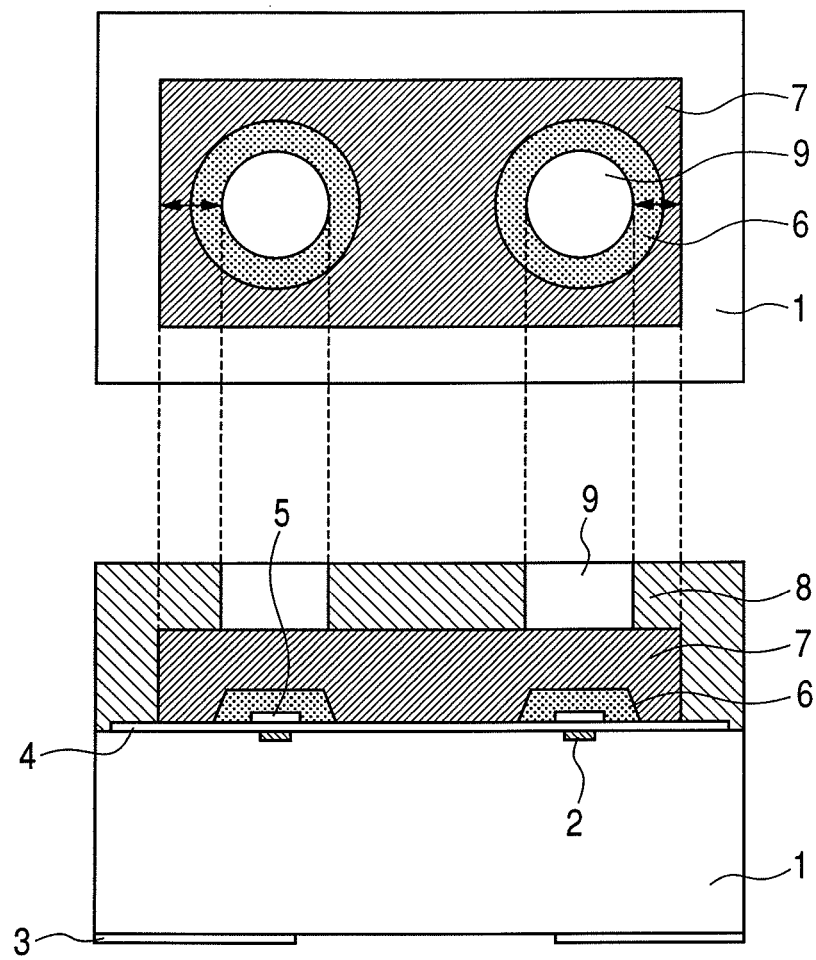
FIG. 1 is a top view schematically illustrating an embodiment of a positional relationship among a first ink flow path pattern, a second ink flow path pattern and a discharge port.

Next, according to Embodiment 1, the protective film 4 was subjected to spin coating with a liquid comprising polymethylisopropenylketone, which was added with a light absorption agent therein, and baked for 6 minutes at 120° C., so that the first ink flow path pattern layer 6' was formed, as shown in FIG. 3B. Further, the additive amount of the light absorption agent in this embodiment was 5 parts by mass with respect to the 100 parts by mass of polymethylisobutylketone. A film thickness of the first ink flow path pattern layer 6' was 5 μm, and the absorbance in the ultraviolet wavelength of 365 nm of the first ink flow path pattern layer 6' was 0.8. Then, the pattern of the first ink flow path pattern layer 6' was exposed under 6 J/cm² by using the aligner UX3000 (brand name) made by Ushio Inc., and developed by using MIBK (methyl isobutyl ketone), and then rinsed by using IPA (isopropyl alcohol). As shown in FIG. 3C, the first ink flow path pattern 6 was formed. Further, as shown in FIG. 1, the first ink flow path pattern 6 was formed at the coated region where the discharge port 9 is formed as viewed from above the substrate 1, and within the region where the second ink flow path pattern 7 is formed.

Further according to Embodiment 1, the substrate 1 was next subjected to spin coating with a liquid comprising polymethylisopropenylketone which does not having the light absorption agent contained therein, and baked for 6 minutes at 120° C., to provide a layer suitable for forming the second ink flow path pattern 7. A film thickness of the second ink flow path pattern 7 was 15 μm at the position where the first ink flow path pattern 6 was formed. Then, the pattern of the second ink flow path pattern 7 was exposed under 20 J/cm² by using the aligner UX3000 (brand name) made by Ushio Inc., and developed by using MIBK (methyl isobutyl ketone), and then rinsed by using IPA (isopropyl alcohol). As shown in FIG. 3D, the second ink flow path pattern 7 was formed. As shown in FIG. 1, the second ink flow path pattern 7 coats the previously formed first ink flow path pattern 6.

As a next step in Embodiment 1, spin coating was performed on the substrate 1 with liquid which was made by dissolving the resin composition shown in Table 1 into a solvent, and the substrate 1 was baked for 3 minutes at 90° C., so that the nozzle forming material layer 8 was formed, as shown in FIG. 3E. A film thickness of the nozzle forming material layer 8 was 5 μm at the position where the second ink flow path pattern 7 was formed. Next, the pattern of the nozzle forming material layer 8 was exposed under 5500 J/m² by the wavelength of 365 nm using the i-line exposure system made by Canon Inc. (FIG. 3E), and heated for 4 minutes at 90° C., and then developed with the MIBK, so that the discharge port 9 was formed as shown in FIG. 3F. The size of the discharge port was made to be a diameter of 10 μm.

As a next step in Embodiment 1, as shown in FIG. 3G, the ink supply port 10 was formed by performing silicon anisotropic etching on the substrate 1. Then, the entire surface of the substrate 1 was irradiated with the ultraviolet light by using the aligner UX3000 (brand name) made by Ushio Inc., and the protective film 4 on the ink supply port 10, the first ink flow path pattern 6 and the second ink flow path pattern 7 were dissolved and removed. In addition, the substrate 1 was heated for 1 hour at 200° C. in order to completely cure the epoxy resin included in the nozzle forming material layer 8, so that the ink jet recording head was obtained as shown in FIG. 3H.

As a result of the evaluation on discharging and recording of a printer mounted with the thus-obtained ink jet recording head, it was possible to record an image very well.

Embodiments 2 to 4 were implemented the same way as Embodiment 1 except that the absorbance of the first ink flow path pattern layer 6' was set to a value as shown in Table 2 by adjusting the amount of the light absorption agent used therein. In addition, the additive amount of the light absorption agent was set to a value of 1.3 parts by mass (Embodiment 2), 7.5 parts by mass (Embodiment 3), 18.8 parts by mass (Embodiment 4), and 0.65 parts by mass (Embodiment 5) with respect to 100 parts by mass of polymethylisobutylketone, respectively.

As a result of the evaluation on discharging and recording of a printer mounted with the thus-obtained ink jet recording head, it was possible to record an image very well. The ink jet recording head obtained in Embodiment 5 had a discharge port with a slight deformation, but there was no problem in functionality of the discharge port. In addition, in Embodiment 4, the exposing amount was increased in order to remove the first ink flow path pattern 6.

COMPARATIVE EXAMPLE 1

Comparative Example 1 was implemented the same way as Embodiment 1 except that the light absorption agent was not used. As a result of the evaluation on discharging and recording of a printer mounted with the thus-obtained ink jet recording head, the obtained image was determined to be scattered.

The absorbance of the first pattern 6, observation results of the discharge port, and an ability to remove the flow path pattern for each embodiment is shown in Table 2.

TABLE 1

Nozzle Forming Material

| Epoxy resin | Cationic polymerization initiator | Additive agent(silane coupling agent) |
|---|---|---|
| EHPE3150 (brand name of Daisel chemical industries. Ltd.) 100 parts | SP-172 (brand name of Asahi Denka Co., Ltd.) 2 parts | A-187 ® (trade name of Nippon Unicar Company. Ltd.) 5 parts |

TABLE 2

Effect Of Absorbance

| | Absorbance | Discharge port deformation | Flow path pattern removal | Recording Evaluation |
|---|---|---|---|---|
| Embodiment 1 | 0.8 | None | Good | Good |
| Embodiment 2 | 0.2 | None | Good | Good |
| Embodiment 3 | 1.2 | None | Good | Good |
| Embodiment 4 | 3 | None | Increase in the exposing amount | Good |
| Embodiment 5 | 0.1 | Slightly deformed | Good | Good |
| Comparative Example 1 | 0 | Deformed | Good | Scattered |

Accordingly, embodiments of the invention provide a method of manufacturing an ink jet recording head that can suppress deformation in a space of a pattern of a discharge port that is due to reflected light from a substrate surface when the pattern of the discharge port is exposed to light. The method also can prevent a patterning accuracy from being lowered by the suppressed deformation. Furthermore, embodiments of the invention provide an ink jet recording head that has a nozzle with relatively high accuracy and that can realize a good printing quality level.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-014759, filed Jan. 25, 2008, which is hereby incorporated by reference herein in its entirety.

What is claimed is:

1. A method of manufacturing a liquid discharge head, which includes a flow path forming member configured to form a flow path communicating with a discharge port to discharge liquid, the method comprising:
    providing a first layer which includes a photosensitive resin and a light absorption agent on a substrate;
    patterning the first layer to form a patterned first layer corresponding to the discharge port;
    providing a second layer which includes a positive photosensitive resin but substantially does not include the light absorption agent on the substrate, so as to coat a surface of the patterned first layer;
    forming a pattern having a shape corresponding to the flow path by performing a patterning process including exposure of a portion of the second layer;
    providing a layer which becomes the flow path forming member on the substrate, so as to coat the pattern;
    forming the discharge port by performing a patterning process including exposure of the layer which becomes the flow path forming member, wherein the light absorption agent included in the first layer absorbs light having a wavelength used in the exposure of the layer which becomes the flow path forming member; and
    forming the flow path by removing the pattern.

2. The method according to claim 1, wherein the photosensitive resin included in the first layer is the same as the positive photosensitive resin included in the second layer.

3. The method according to claim 1, wherein an i-line is used when the patterning process including the exposure of the layer which becomes the flow path forming member is performed, and the first layer has an absorbance of 0.1 to 2.0 for light having a wavelength of 365 nm over the entire thickness.

4. The method according to claim 1, wherein the pattern comprises the second layer covering the first layer so as not to expose the first layer.

5. The method according to claim 1, wherein the patterned first layer is provided at a position opposite a position where the discharge port is formed.

6. The method according to claim 1, wherein the patterned first layer is positioned at a region that is below the discharge port formed in the layer which becomes the flow path forming member, as viewed from above the discharge port in a direction of the substrate, when the layer which becomes the flow path forming member is exposed in the patterning process.

7. The method according to claim 1, wherein the first layer is in direct contact with the substrate.

* * * * *